(12) United States Patent
Li

(10) Patent No.: US 12,278,314 B2
(45) Date of Patent: Apr. 15, 2025

(54) SUBSTRATE STRUCTURE WITH HIGH DENSITY LAYOUT AND ELECTRONIC DEVICE USING THE SAME

(71) Applicant: PanelSemi Corporation, New Taipei (TW)

(72) Inventor: Chin-Tang Li, Tainan (TW)

(73) Assignee: PANELSEMI CORPORATION, New Taipei (TW)

( * ) Notice: Subject to any disclaimer, the term of this patent is extended or adjusted under 35 U.S.C. 154(b) by 670 days.

(21) Appl. No.: 17/555,727

(22) Filed: Dec. 20, 2021

(65) Prior Publication Data
US 2022/0231198 A1 Jul. 21, 2022

(30) Foreign Application Priority Data
Jan. 20, 2021 (TW) ................................ 110102209

(51) Int. Cl.
*H01L 33/48* (2010.01)
*H01L 25/075* (2006.01)
*H01L 33/62* (2010.01)

(52) U.S. Cl.
CPC ........ *H01L 33/483* (2013.01); *H01L 25/0753* (2013.01); *H01L 33/62* (2013.01)

(58) Field of Classification Search
None
See application file for complete search history.

(56) References Cited

U.S. PATENT DOCUMENTS 3,077,511 A * 2/1963 Bohrer ................. H05K 3/4046
361/779
3,787,252 A * 1/1974 Filippazzi ......... H01L 21/76297
257/587
(Continued)

FOREIGN PATENT DOCUMENTS

CN          1315055 A  *  9/2001  ....... H01L 23/49816
CN        111033771 A  *  4/2020  ....... H01L 23/49822
(Continued)

OTHER PUBLICATIONS

Original_translation_Jp2009244800 (Year: 2009).*

*Primary Examiner* — Binh B Tran
*Assistant Examiner* — Muhammed Azam
(74) *Attorney, Agent, or Firm* — MUNCY, GEISSLER, OLDS & LOWE, P.C.

(57) ABSTRACT

A substrate structure includes a carrier board and a laminated structure. The carrier board has a board body, through holes and conductive portions. The board body has a first surface and a second surface. The through holes communicate the first and second surfaces. Each through hole has a first opening and a second opening. The conductive portions are arranged on the first surface, and the first opening is sealed by a corresponding conductive portion. The laminated structure includes a viscid layer and conductive elements. One surface of the viscid layer is in surface contact with the second surface. Each conductive element passes through and accommodates in the viscid layer, and corresponds to one through hole in a projection direction of the carrier board. One end of each conductive element is electrically connected to one conductive portion through the corresponding through hole.

16 Claims, 5 Drawing Sheets

(56) References Cited

U.S. PATENT DOCUMENTS

| | | | | |
|---|---|---|---|---|
| 5,203,075 A * | 4/1993 | Angulas | H01R 12/52 | 29/830 |
| 5,873,161 A * | 2/1999 | Chen | H05K 3/361 | 29/830 |
| 6,225,569 B1 * | 5/2001 | Hashimoto | H05K 3/246 | 257/781 |
| 6,395,993 B1 * | 5/2002 | Nakamura | H05K 3/4635 | 361/767 |
| 6,800,815 B1 * | 10/2004 | Ehlert | H01L 23/49822 | 361/767 |
| 6,809,267 B1 * | 10/2004 | Kurita | H05K 3/361 | 174/254 |
| 7,514,298 B2 * | 4/2009 | Tanaka | H01L 23/49816 | 257/692 |
| 7,568,922 B2 * | 8/2009 | Yamashita | H01L 23/49816 | 439/83 |
| 8,183,467 B2 * | 5/2012 | Kaneko | H01L 21/6835 | 257/781 |
| 8,209,856 B2 * | 7/2012 | Mori | H05K 1/113 | 29/829 |
| 8,354,684 B2 * | 1/2013 | West | H01L 33/644 | 362/800 |
| 8,487,445 B1 * | 7/2013 | Do | H01L 24/14 | 257/773 |
| 9,006,871 B2 * | 4/2015 | Fujisawa | H01L 23/562 | 257/667 |
| 9,137,886 B2 * | 9/2015 | Lee | H05K 1/113 | |
| 9,426,887 B2 * | 8/2016 | Hosoi | H05K 1/115 | |
| 9,627,254 B2 * | 4/2017 | Burgess | H01L 21/76838 | |
| 10,573,597 B1 * | 2/2020 | Li | H01L 23/5385 | |
| 11,678,438 B2 * | 6/2023 | Li | H05K 1/115 | 361/783 |
| 11,917,758 B2 * | 2/2024 | Hsueh | H05K 1/116 | |
| 2006/0246706 A1 * | 11/2006 | Ke | H01L 24/11 | 257/E21.508 |
| 2007/0057364 A1 * | 3/2007 | Wang | H01L 33/642 | 257/E25.02 |
| 2008/0142252 A1 * | 6/2008 | Mayder | H05K 1/113 | 174/262 |
| 2008/0308308 A1 * | 12/2008 | Kobayashi | H01L 21/4853 | 174/257 |
| 2009/0133917 A1 * | 5/2009 | Horiuchi | H05K 1/113 | 174/261 |
| 2012/0256320 A1 * | 10/2012 | Kaneko | H01L 24/16 | 257/774 |
| 2014/0353025 A1 * | 12/2014 | Jang | H05K 3/421 | 29/829 |
| 2018/0188290 A1 * | 7/2018 | Park | H05K 3/285 | |
| 2021/0408348 A1 * | 12/2021 | Li | H01L 25/167 | |
| 2022/0231198 A1 * | 7/2022 | Li | H05K 1/113 | |
| 2022/0359213 A1 * | 11/2022 | Hung | H01L 21/187 | |
| 2023/0092816 A1 * | 3/2023 | Li | H05K 1/113 | 174/261 |
| 2023/0187333 A1 * | 6/2023 | Tu | H01L 21/486 | 257/668 |
| 2023/0198146 A1 * | 6/2023 | Chen | H01Q 3/36 | 343/853 |
| 2023/0318184 A1 * | 10/2023 | Li | H01Q 1/22 | 343/702 |
| 2023/0420832 A1 * | 12/2023 | Chen | H01Q 21/065 | |
| 2024/0090129 A1 * | 3/2024 | Li | H05K 1/144 | |
| 2024/0098896 A1 * | 3/2024 | Li | H01L 24/13 | |
| 2024/0145415 A1 * | 5/2024 | Chen | H01L 23/66 | |

FOREIGN PATENT DOCUMENTS

| | | | | |
|---|---|---|---|---|
| CN | 114080100 A | * | 2/2022 | |
| CN | 114695304 A | * | 7/2022 | |
| JP | H1117297 A | * | 1/1999 | |
| JP | 2004282032 A | * | 10/2004 | H01L 23/49816 |
| JP | 2013118255 A | * | 6/2013 | H01L 23/145 |
| WO | WO-9106977 A1 | * | 5/1991 | |
| WO | WO-0156339 A1 | * | 8/2001 | H05K 3/361 |
| WO | WO-2004103039 A1 | * | 11/2004 | H01L 21/486 |
| WO | WO-2016199399 A1 | * | 12/2016 | H01L 21/304 |

* cited by examiner

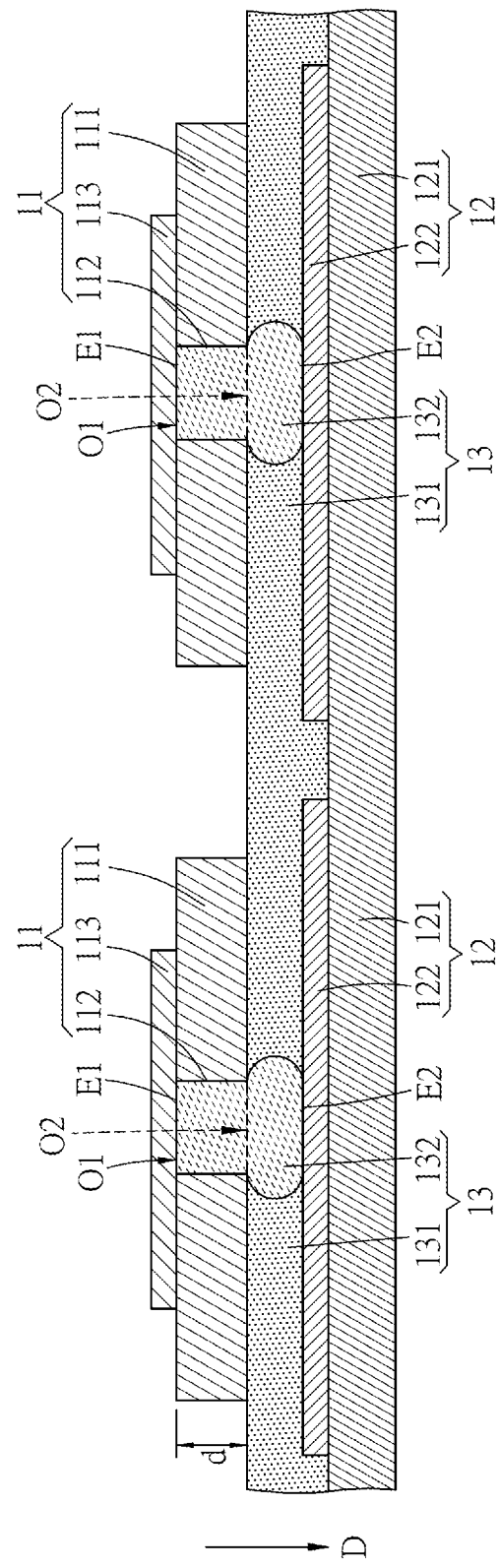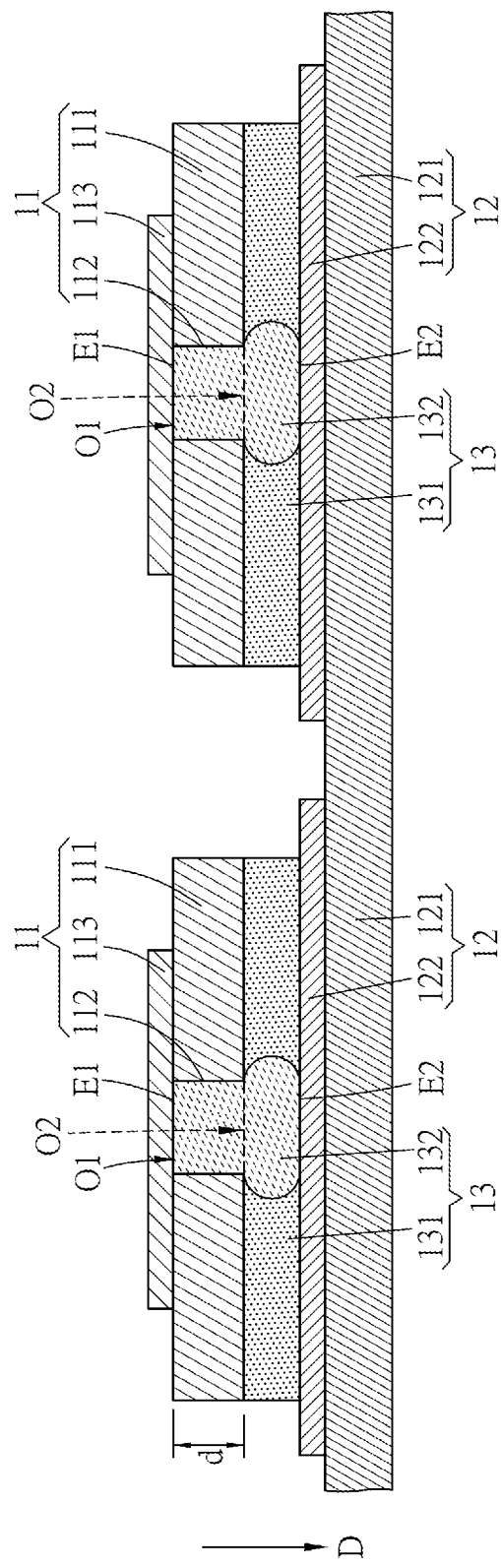

SUBSTRATE STRUCTURE WITH HIGH DENSITY LAYOUT AND ELECTRONIC DEVICE USING THE SAME

CROSS REFERENCE TO RELATED APPLICATIONS

This Non-provisional application claims priority under 35 U.S.C. § 119(a) on Patent Application No(s). 110102209 filed in Taiwan, Republic of China on Jan. 20, 2021, the entire contents of which are hereby incorporated by reference.

BACKGROUND

Technology Field

The present disclosure relates to a substrate structure and, in particular, to a substrate structure and an electronic device having the substrate structure.

Description of Related Art

Light-emitting diodes (LEDs), Mini LEDs, or Micro LEDs are light-emitting components made of semiconductor materials. The light-emitting component has two electrode terminals. When a voltage (very small voltage) is applied between the electrode terminals, the electrons and electron holes in the semiconductor layers can combine so as to release the energy in the form of light.

Different from the incandescent light bulbs, LEDs, Mini LEDs, or Micro LEDs are luminescence components, which have the advantages of low power consumption, long component life, no warm-up time, and fast response speed. In addition, the LED components further have the features of small size, vibration resistance, suitable for mass production, so that they can be easily made into extremely small or array modules according to application needs. Thus, the LED components can be widely used in lighting equipment, indicator of information, communication, and consumer electronic product, the backlight module of display device, and the display device itself, and they have become one of the indispensable important components in daily life. Therefore, it is desired to increase the arrangement density of components in LED, Mini LED or Micro LED.

SUMMARY

The present disclosure provides a substrate structure and an electronic device including the substrate structure that have a design of high density layout.

One or more exemplary embodiments of this present disclosure provide a substrate structure, which includes a carrier board and a laminated structure. The carrier board has a board body, a plurality of through holes, and a plurality of conductive portions. The board body is defined with a first surface and a second surface opposite to each other. The through holes communicate the first surface and the second surface of the board body, and each of the through holes is defined with a first opening and a second opening opposite to each other. The conductive portions are arranged on the first surface of the board body, and the first opening of each through hole is sealed by corresponding one of the conductive portions. The laminated structure includes a viscid layer and a plurality of conductive elements. The viscid layer is defined with two surfaces, and one of the surfaces of the viscid layer is in surface contact with the second surface of the board body. Each of the conductive elements passes through and accommodates in the viscid layer, and corresponds to one of the through holes of the carrier board in a projection direction of the carrier board. One end of each conductive element is electrically connected to one of the conductive portions through the corresponding through hole.

One or more exemplary embodiments of this present disclosure provide an electronic device, which includes a carrier board, a target supporting board, and a laminated structure. The carrier board has a board body, a plurality of through holes, and a plurality of conductive portions. The board body is defined with a first surface and a second surface opposite to each other. The through holes communicate the first surface and the second surface of the board body, and each of the through holes is defined with a first opening and a second opening opposite to each other. The conductive portions are arranged on the first surface of the board body, and the first opening of each through hole is sealed by corresponding one of the conductive portions. The target supporting board has a target board body and a plurality of target conductive portions. One surface of the target board body close to the carrier board is defined as a supporting surface, the target conductive portions are arranged on the supporting surface of the target board body, and at least a part of the target conductive portions of the target supporting board correspond to the through holes of the carrier board in a projection direction of the carrier board. The laminated structure is arranged between the carrier board and the target supporting board. The laminated structure includes a viscid layer and a plurality of conductive elements. One surface of the viscid layer is in surface contact with the second surface of the board body, and another surface of the viscid layer is in surface contact with the supporting surface of the target board body. Each of the conductive elements passes through and accommodates in the viscid layer. In the projection direction of the carrier board, one end of each of the conductive elements is electrically connected to one of the conductive portions through the corresponding through hole, and another end of the conductive element is electrically connected to one of the target conductive portions.

In one exemplary embodiment, the board body is a resilient board, a rigid board or a composite board.

In one exemplary embodiment, the thickness of the board body is less than or equal to 0.2 mm.

In one exemplary embodiment, the diameter of the through hole is less than or equal to 200 μm.

In one exemplary embodiment, the diameter of the through hole is less than or equal to 100 μm.

In one exemplary embodiment, the material of the conductive element includes tin, copper, silver or gold, or an alloy of any combination thereof, or an intermetallic compound.

In one exemplary embodiment, the conductive element is a conductive wire.

In one exemplary embodiment, the viscid layer includes a non-conductive polymer material.

In one exemplary embodiment, at least a part of the conductive portions are multiple conductive pads.

In one exemplary embodiment, the carrier board includes a conductive pattern layer, and the conductive pattern lay is electrically connected to the conductive portions.

In one exemplary embodiment, at least a part of the conductive portions are a part of a conductive pattern layer.

In one exemplary embodiment, the conductive pattern layer is arranged on the first surface of the board body.

In one exemplary embodiment, the viscid layer is a fluid with viscoelasticity.

In one exemplary embodiment, the electronic device further includes a plurality of electronic components arranged on the first surface of the carrier board, each of the electronic components includes an electrode, and the electrode is electrically connected to one of the conductive portions.

In one exemplary embodiment, the electronic components include a plurality of photoelectric chips or photoelectric packages.

In one exemplary embodiment, the electronic device includes a plurality of carrier boards.

In one exemplary embodiment, the electronic device includes a plurality of viscid layers, and the viscid layers correspond to the carrier boards.

In one exemplary embodiment, the target board body is a resilient board, a rigid board, or a composite board.

BRIEF DESCRIPTION OF THE DRAWINGS

The disclosure will become more fully understood from the detailed description and accompanying drawings, which are given for illustration only, and thus are not limitative of the present disclosure, and wherein:

FIGS. 4 to 6 are schematic diagrams showing parts of electronic devices according to different embodiments of this disclosure.

DETAILED DESCRIPTION OF THE DISCLOSURE

The present disclosure will be apparent from the following detailed description, which proceeds with reference to the accompanying drawings, wherein the same references relate to the same elements.

Figure 1A:
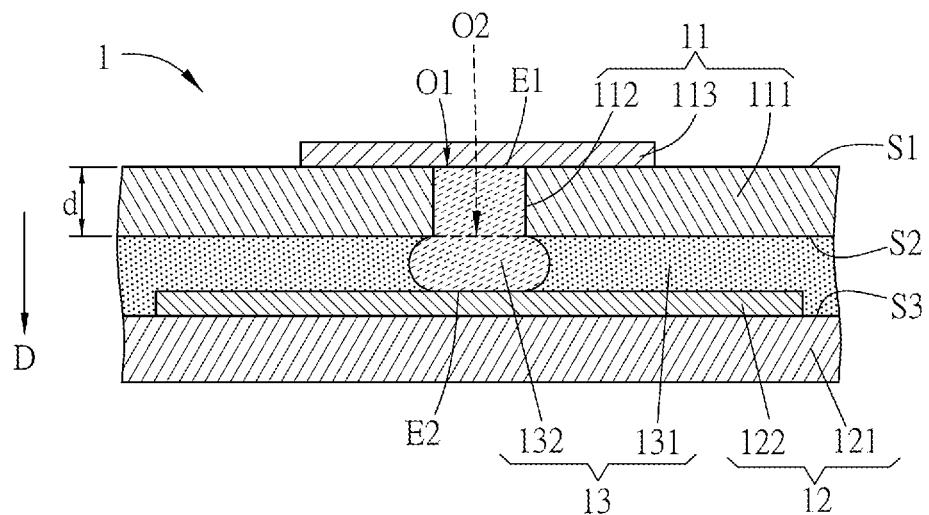
FIG. 1A is a schematic diagram showing a part of an electronic device according to an embodiment of this disclosure.

FIG. 1A is a schematic diagram showing a part of an electronic device 1 according to an embodiment of this disclosure. The electronic device 1 of this embodiment can be an AM electronic device or a PM electronic device, but this disclosure is not limited thereto. The electronic device 1 includes at least a carrier board 11, a target supporting board 12, and at least a laminated structure 13. The laminated structure 13 is arranged between the carrier board 11 and the target supporting board 12. Herein, the carrier board 11 is arranged on the target supporting board 12 through the laminated structure 13.

The carrier board 11 includes a board body 111, a plurality of through holes 112, and a plurality of conductive portions 113. The board body 111 is defined with a first surface S1 (upper surface) and a second surface S2 (lower surface), which are opposite to each other. In addition, the board body 111 is defined with a thickness d, which is less than or equal to 0.2 mm. Optionally, the thickness d can be, for example, 10 μm, 20 μm, 30 μm, 100 μm, 400 μm, 500 μm, 700 μm, 1200 μm, 1500 μm, or the like. The board body 111 usually has a uniform thickness d, but this disclosure is not limited thereto. When the board body 111 has a non-uniform thickness, the thickness d is defined as the minimum thickness of the entire board body 111.

The board body 111 can be a resilient board, a semi-rigid board, a rigid board, or a composite board. In some cases, the semi-rigid board could be elaborated as the resilient board, or one of the composite boards. For example, the board body 111 can be a glass substrate, a metal substrate, or a ceramic substrate, a PI substrate, or a substrate made of a composite material at least including the above-mentioned materials. To be understood, when the thickness of the resilient board increases, the physical properties thereof can approach that of the rigid board. The board body 111 can include a glass material, a PI material, or the combination thereof. In some embodiments, the board body 111 can be a transparent board. In some cases, a semi-transparent board could be elaborated as one kind of the transparent boards.

The through holes 112 of the carrier board 11 communicate the first surface S1 and the second surface S2 of the board body 111, and each of the through holes 112 is defined with a first opening O1 and a second opening O2 opposite to each other. The dimension of the first opening O1 can be equal to or different from that of the second opening O2. Each through hole 112 is defined with a diameter, which can be a minimum diameter. In some embodiments, the diameter of each through hole 112 is less than or equal to 200 μm. In some embodiments, the diameter of each through hole 112 is less than or equal to 100 μm. For example, the diameter of each through hole 112 can optionally be 15 μm, 20 μm, 30 μm, 50 μm, 100 μm, or the like. Herein, the through hole 112 can have a uniform diameter (i.e., the through hole 112 has one diameter value); or the diameter of the through hole 112 is not uniform (e.g. the through hole 112 has a narrower middle portion and wider top and bottom portions, or the through hole 112 is gradually wider from bottom to top or from top to bottom). In addition, each through hole 112 can be further defined with a depth-diameter ratio (the ratio of the depth of the through hole 112 to the diameter of the through hole 112). Herein, the depth of each through hole 112 can be realized as the thickness d of the board body 111. For example, when the board body 111 has a uniform thickness, the depths of all through holes 112 are equal to the thickness d of the board body 111. Otherwise, when the board body 111 does not have a uniform thickness, the depths of all through holes 112 are different values. In one aspect, optionally, the depth-diameter ratio is greater than or equal to 0.1 and is less than or equal to 75 (0.1≤depth-diameter ratio≤75). For example, the depth-diameter ratio of each through hole 112 can optionally be 0.1 (e.g. 50 μm/500 μm), 0.67 (e.g. 10 μm/15 μm), 1.33 (e.g. 20 μm/15 μm), 6.67 (e.g. 100 μm/15 μm), 25 (e.g. 500 μm/20 μm), 33.33 (e.g. 500 μm/15 μm), 35 (e.g. 700 μm/20 μm), 46.67 (e.g. 700 μm/15 μm), 73.33 (e.g. 1100 μm/15 μm), or the like.

The conductive portions 113 are arranged on the first surface S1 of the board body 111, and the first opening O1 of each through hole 112 is sealed by corresponding one of the conductive portions 113. In other words, when viewing from the top of the board body 111 in a projection direction D of the carrier board 11, the through hole 112 cannot be seen since the through hole 112 is completely covered by the corresponding conductive portion 113. In some embodiments, at least a part of the conductive portions 113 are multiple conductive pads. When the conductive portion 113 is a conductive pad, it can be used to electrically connect the electrode of LED, Mini LED or Micro LED. Certainly, when the conductive portions 113 are a conductive layer, such as a part of an entire conductive layer, or a part of the combination of the conductive layer and conductive pads.

The target supporting board 12 has a target board body 121 and a plurality of target conductive portions 122. One surface of the target board body 121 close to the carrier board 11 is defined as a supporting surface S3, and the target conductive portions 122 are arranged on the supporting surface S3 of the target board body 121. In addition, at least a part of the target conductive portions 122 of the target supporting board 12 correspond to the through holes 112 of the carrier board 11 in the projection direction D of the carrier board 11. As shown in FIG. 1A, for example, one target conductive portion 122 corresponds to one through hole 112 of the carrier board 11 in the projection direction D of the carrier board 11. In some embodiments, the target supporting board 12 can be, for example, a driving circuit board, which includes at least one driving component for driving the electronic component arranged on the carrier board 11 (not shown in FIG. 1A). The above-mentioned driving component can be arranged on the first surface S1 or/and the second surface S2 of the board body 111 of the carrier board 11. The driving component can include at least one of TFT, silicon IC and non-silicon IC, and this disclosure is not limited thereto.

The target supporting board 12 can be a resilient board, a semi-rigid board, a rigid board, or a composite board. In some cases, the semi-rigid board could be elaborated as the resilient board, or one of the composite boards. In some embodiments, the target board body 121 can be a print circuit board (e.g. FR4) or a resilient board made of PI. In some embodiments, the target conductive portions 122 can be conductive pads or a part of a conductive pattern (e.g. a conductive layer). In some embodiments, the material of the above-mentioned conductive portions 113 or/and the target conductive portions 112 can include, for example, a metal (e.g. gold, copper, or aluminum), a combination of the metals, a combination of alloys of the metals, or any of other conductive materials.

The laminated structure 13 is arranged between the carrier board 11 and the target supporting board 12. The laminated structure 13 includes a viscid layer 131 and a plurality of conductive elements 132. In some cases, the viscid layer 131 is glutinous or sticky consistency, with high viscosity, such as a paste, glue, oil textures, or the like; in some cases, the viscid layer 131 is characteristic between solid and liquid. One surface of the viscid layer 131 is in surface contact with the second surface S2 of the board body 111, and another surface of the viscid layer 131 is in surface contact with the supporting surface S3 of the target board body 121. Herein, the other surface of the viscid layer 131 also covers the target conductive portion 122. In addition, each conductive element 132 is arranged in one corresponding through hole 112 of the carrier board 11, and each conductive element 132 passes through and accommodates in the viscid layer 131. Accordingly, each conductive element 132 corresponds to one of the through holes 112 of the carrier board 11 in the projection direction D of the carrier board 11. In the projection direction D of the carrier board 11, one end E1 of each of the conductive elements 132 is electrically connected to one of the conductive portions 113 through the corresponding through hole 112, and another end E2 of the conductive element 132 is electrically connected to one of the target conductive portions 122. In this embodiment, the conductive element 132 fully fills the corresponding through hole 112 and further extends to the target supporting board 12 to contact the corresponding target conductive portion 122. Certainly, in different embodiments, the conductive element 132 may not fully fill the corresponding through hole 112 as long as the conductive element 132 can electrically connect the corresponding conductive portion 113 and the corresponding target conductive portion 122. For example, one end E1 of the conductive element 132 is electrically connected to the corresponding conductive portion 113, and the other end E2 of the conductive element 132 is electrically connected to the corresponding target conductive portion 122. Therefore, the conductive portion 113 of the carrier board 11 can be electrically connected to the target conductive portion 122 of the target supporting board 12 via the conductive element 132 in the corresponding through hole 112. To be understood, the contact surface between the conductive element 132 and the conductive portion 113 is determined based on the diameter of the through hole 112 (i.e. the dimension of the first opening O1). In general, the larger the diameter (the first opening O1) is, the larger the contact surface between the conductive element 132 and the conductive portion 113 is. Even if the diameter (the dimension of the first opening O1) of the through hole 112 is limited, the total contact surface of the same conductive portion 113 of the carrier board 11 can still be enlarged as the number of the through holes 112 is increased.

In some embodiments, the viscid layer 131 can be an insulation adhesive or a fluid with adhesion and elasticity. Herein, the fluid with adhesion and elasticity can be, for example, silicone oil. The silicone oil is a material with very good viscoelasticity, and it can provide greater adhesion in the vertical direction and lower shear strength along the projection direction D. Herein, the lower shear strength means that the lateral force is easy to make the material move, but the material is easy to return to the original position once the lateral force is removed. In some embodiments, the viscid layer 131 can be an anisotropic conductive film (ACF) or a non-conductive film (NCF). In some embodiments, the viscid layer 131 is only made of non-conductive polymer materials (e.g. excluding conductive particles). In some embodiments, the material of the conductive element 132 can include, for example but not limited to, tin, copper, silver, gold, or an alloy of any combination thereof (e.g. an alloy containing copper and a metal other than tin), or an intermetallic compound formed by heating or pressing. In some embodiments, the conductive element 132 can be arranged in the through hole 112 by implanting solder balls, solder jetting, filling a copper paste, placing a conductive wire, or any of other methods.

In some embodiments, the carrier board 11 further includes a conductive pattern layer (not shown), which is electrically connected to the conductive portions 113. Herein, the conductive pattern layer can be, for example, distributed on the first surface S1 of the board body 111 and contact the conductive portions 113 to form electrical connection. To be noted, in the conventional art, the electronic components and conductive elements (e.g. solder bumps) are arranged on the same surface of the carrier board (similar to the first surface S1 of the board body 111). Unlike the conventional art, in this disclosure, the electronic components are arranged on the first surface S1 of the board body 111, but the conductive elements 132 (e.g. solder bumps) are arranged in the through holes 112, which penetrates the first surface S1 and the second surface S2 of the board body 111, instead of the first surface S1 of the board body 111. In addition, the conductive elements 132 are covered by the conductive portions 113 in the projection direction D. In different embodiments, the conductive pattern layer of the carrier board 11 can be arranged on the second surface S2 of the board body 111 or on both of the first surface S1 and the second surface S2 of the board body 111, and this disclosure is not limited thereto.

The above-mentioned conductive pattern layer further includes signal lines for transmitting electrical signals. If the electronic device is, for example, a display device, the conductive pattern layer can include at least one first signal line and at least one second signal line. For example, the first signal lines are arranged as lateral lines on the first surface S1 of the board body 111, the second signal lines are arranged as vertical lines on the first surface S1 of the board body 111, and the first signal lines are interlaced with the second signal lines. In some embodiments, the first signal lines and the second signal lines are a conductive circuit (e.g. scan circuit or/and data circuit) for transmitting electrical signals, and the configuration of the first signal lines and the second signal lines depends on the function and usage of the electronic device. In some embodiments, at least a part of the conductive portions 113 can be a part of the conductive pattern layer. That is, at least a part of the conductive portions 113 can be the conductive layer of the conductive pattern layer. This disclosure is not limited thereto.

As mentioned above, in the electronic device 1 of this embodiment, the conductive portions 113 of the carrier board 11 are arranged on the first surface S1 of the board body 111, and the first opening O1 of each through hole 112 is sealed by the corresponding conductive portion 113. The target conductive portions 122 of the target supporting board 12 are arranged on the supporting surface S3 of the target board body 121, and at least a part of the target conductive portions 122 of the target supporting board 12 correspond to the through holes 112 of the carrier board 11 in the projection direction D of the carrier board 11. The laminated structure 13 is arranged between the carrier board 11 and the target supporting board 12. One surface of the viscid layer 131 of the laminated structure 13 is in surface contact with the second surface S2 of the board body 111, and the other surface of the viscid layer 131 is in surface contact with the supporting surface S3 of the target board body 121. Each of the conductive elements 132 of the laminated structure 13 passes through and accommodates in the viscid layer 131. In the projection direction D of the carrier board 11, one end E1 of each conductive element 132 is electrically connected to one of the conductive portions 113 through the corresponding through hole 112, and another end E2 of the conductive element 132 is electrically connected to one of the target conductive portions 122 of the target supporting board 12. Based on this design, it is not needed to preserve a region on the first surface S1 of the board body 111 for arranging the through holes 112 and the conductive elements 132, or it is not needed to preserve a region on the first surface S1 of the board body 111 for arranging the conductive elements 132, so that the arrangement density of the conductive circuit (e.g. the conductive portions 113) on the carrier board 11 can be increased, thereby further increasing the arrangement density of the electronic components. This configuration can allow the electronic device to have a higher density layout.

To be understood, the carrier board 11, the target supporting board 12 and the laminated structure 13 of FIG. 1A can be three individual components; or the laminated structure 13 can be combined with the carrier board 11 or the target supporting board 12, and the combined structure is then connected to the residual component. This disclosure is not limited thereto.

Figure 1B:
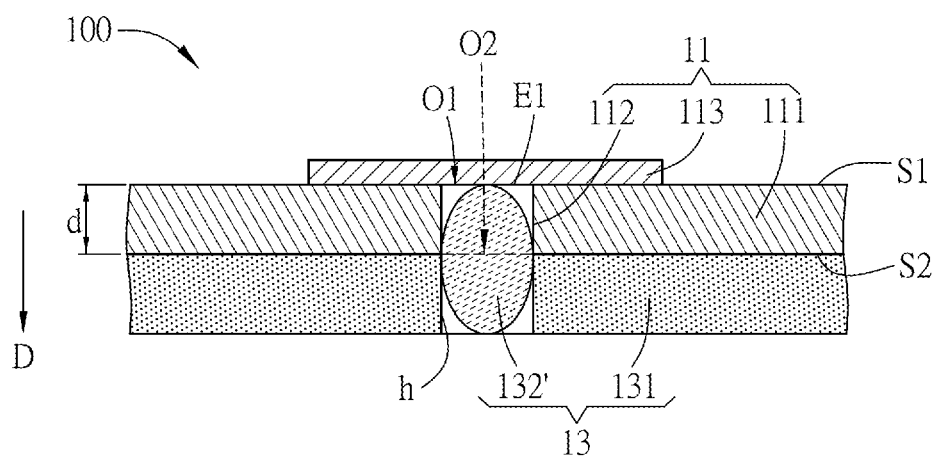
FIG. 1B is a schematic diagram showing a substrate structure according to an embodiment of this disclosure.

FIG. 1B is a schematic diagram showing a substrate structure according to an embodiment of this disclosure. Referring to FIG. 1B, the carrier board 11 and the laminated structure 13 are combined to form a substrate structure 100, which is then combined with the target supporting board 12 to form an electronic device 1. Herein, the target supporting board 12 is connected to the laminated structure 13 of the substrate structure 100. As shown in FIG. 1B, the viscid layer 131 is arranged on the second surface S2 of the carrier board 11, and has through holes h corresponding to the through holes 112 of the carrier board 11. For example, the viscid layer 131 is an adhesive, which is attached to the second surface S2 of the carrier board 11. A laser drilling process is applied to the surface of the adhesive away from the carrier board 11 until the drilled holes reach the corresponding conductive portions 113 or penetrate into the corresponding conductive portions 113 (do not penetrate through the corresponding conductive portions 113 yet), thereby forming the through holes h of the viscid layer 131 and the through holes 112 of the carrier board 11. Then, the solder balls 132' are implanted. In another example, the through holes 112 of the carrier board 11 are formed in advance, and then the through holes h of the viscid layer 131 are formed, followed by implanting the solder balls 132'. In another example, the through holes 112 of the carrier board 11 and the through holes h of the viscid layer 131 are formed at the same time, followed by arranging the corresponding conductive portions 113 and implanting the solder balls 132'. To be noted, the above examples are for illustrations only and are not to limit the scope of this disclosure. After implanting the solder balls 132' into the through holes 112 and the through holes h, some gaps may exist in the through holes 112 and the through holes h. In this case, a heating or pressing step is applied, after aligning the substrate structure 100 to the target supporting board 12, for melting the solder balls 132' to form the conductive elements 132 as shown in FIG. 1A.

Different aspects of the electronic devices and the corresponding substrate structures will be described hereinafter.

Figure 2A:
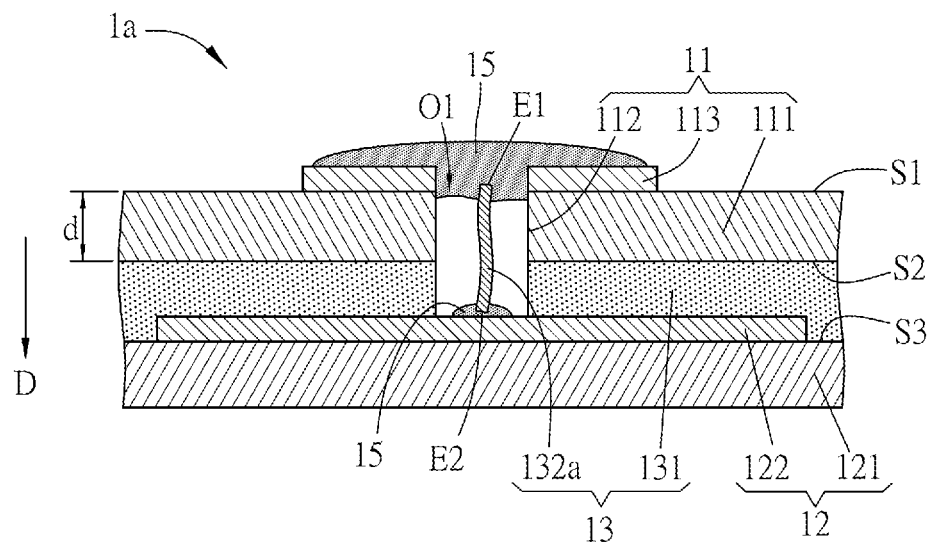
FIG. 2A is a schematic diagram showing a part of an electronic device according to another embodiment of this disclosure.
Figure 2B:
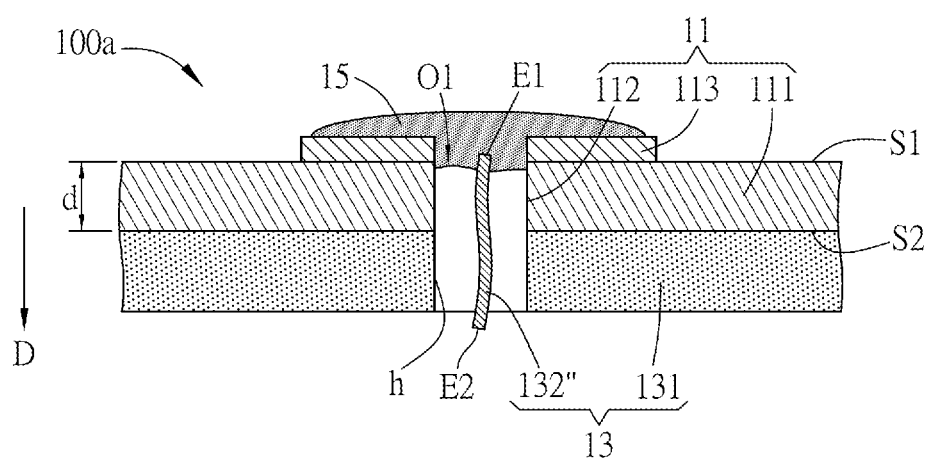
FIG. 2B is a schematic diagram showing a substrate structure according to another embodiment of this disclosure.

FIG. 2A is a schematic diagram showing a part of an electronic device according to another embodiment of this disclosure, and FIG. 2B is a schematic diagram showing a substrate structure according to another embodiment of this disclosure.

Unlike the electronic device 1 of the previous embodiment, in the electronic device 1a of this embodiment as shown in FIG. 2A, the conductive element 132a is a conductive wire, which has one end E1 electrically connected to the conductive portion 113 through the corresponding through hole 112, and another end E2 electrically connected to the corresponding target conductive portion 122. In some embodiments, one through hole 112 can accommodate at least one conductive wire (the conductive element 132a). In this embodiment, for example, each through hole 112 accommodates one conductive wire (one conductive element 132a). In addition, in the substrate structure 100a of FIG. 2B, the viscid layer 131 is arranged on the second surface S2 of the carrier board 11 and is formed with a through hole h corresponding to the through hole 112 of the carrier board 11, followed by implanting a conductive wire 132" into the through hole h. For example, the viscid layer 131 is an adhesive attached to the second surface S2 of the carrier board 11. At this time, the other surface of the viscid layer 131 is still covered by a releasing material. Then, a drilling process is applied to the first surface S1 of the carrier board 11 so as to form the through holes 112 of the carrier board 11 and the through holes h of the viscid layer 131, and the conductive wires 132" are implanted into the holes. After that, the conductive material 15 (e.g. solder paste) is jetted to the first surface S1 of the carrier board 11 for filling the through holes 112, so that the conductive wires 132" on the first surface S1 of the carrier board 11 can be connected to the corresponding conductive portions 113 through the conductive material 15. Then, the releasing material on the other surface of the viscid layer 131 is removed, the conductive material 15 (e.g. solder paste) is jetted to the other end of the conductive wires 132" or the corresponding target conductive portions 122 of the target supporting board 12. Afterwards, the substrate structure 100a is aligned to the target supporting board 12, and then a heating step is applied for melting the conductive wires 132" of the substrate structure 100a to form the conductive elements 132a as shown in FIG. 2A. In some embodiments, the other surface of the viscid layer 131 is processed by a laser drilling process. In this case, the releasing material on the other surface of the viscid layer 131 can be removed before or after forming the through holes 112. To be noted, the above examples are for illustrations only and are not to limit the scope of this disclosure.

Figure 3A:
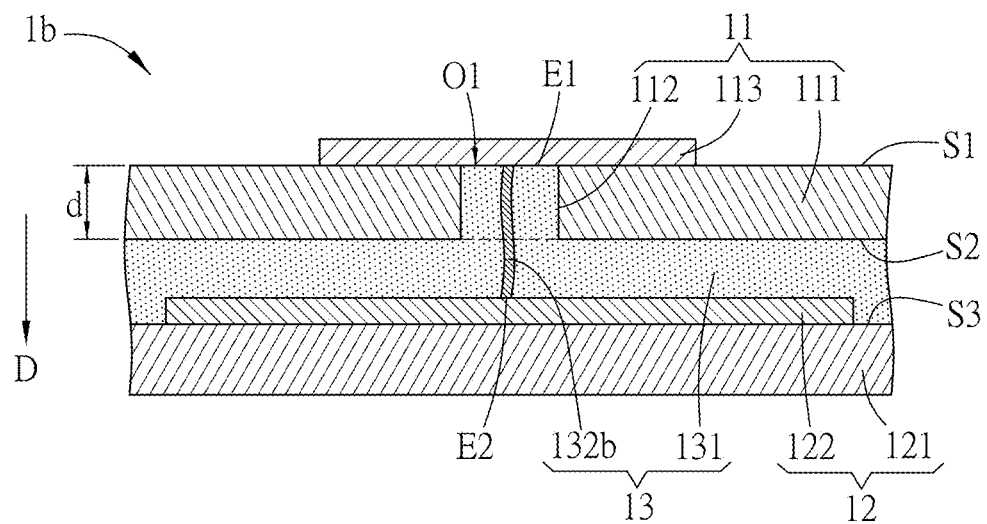
FIG. 3A is a schematic diagram showing a part of an electronic device according to a different embodiment of this disclosure.
Figure 3B:
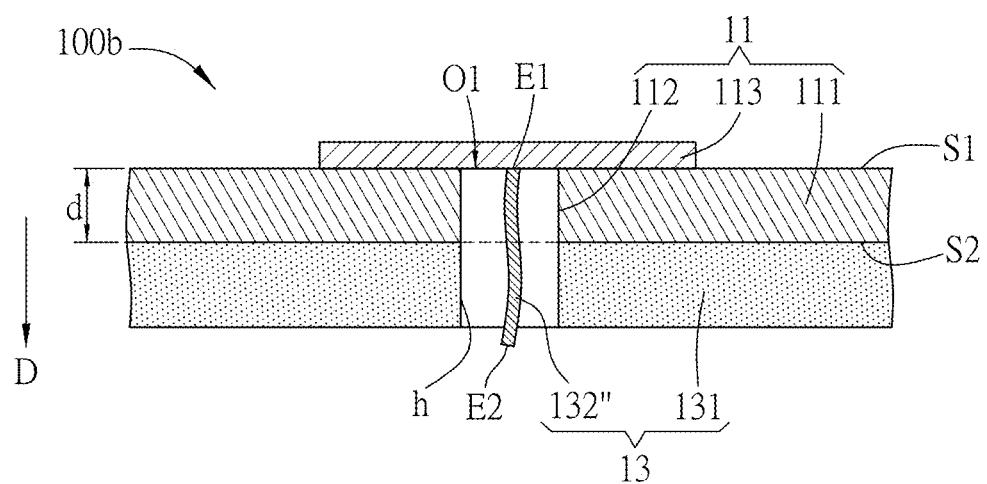
FIG. 3B is a schematic diagram showing a substrate structure according to a different embodiment of this disclosure.

FIG. 3A is a schematic diagram showing a part of an electronic device according to another embodiment of this disclosure, and FIG. 3B is a schematic diagram showing a substrate structure according to another embodiment of this disclosure.

Unlike the electronic device 1 of the previous embodiment, in the electronic device 1b of this embodiment as shown in FIG. 3A, the conductive element 132b is a conductive wire, which has one end E1 electrically connected to the conductive portion 113 through the corresponding through hole 112, and another end E2 electrically connected to the corresponding target conductive portion 122. In addition, in the substrate structure 100b as shown in FIG. 3B, two ends of the conductive wire 132" can be electrically connected to the corresponding conductive portion 113 and the corresponding target conductive portion 122 by a laser process, thereby forming the conductive element 132b of the electronic device 1b as shown in FIG. 3A. In some embodiments, the first surface S1 of the carrier board 11 is formed with the corresponding conductive portions 113 in advance, and then a laser drilling process is applied to the other surface of the viscid layer 131 so as to form the through holes 112 of the carrier board 11 and the through holes h of the viscid layer 131 at the same time. Then, the releasing material on the other surface of the viscid layer 131 is removed after forming the through holes 112. In some embodiments, the conductive wires 132" are implanted into the through holes 112 of the carrier board 11 and the through holes h of the viscid layer 131, then then the insulation adhesive can be optionally applied to fill the holes. To be noted, the above examples are for illustrations only and are not to limit the scope of this disclosure.

In some embodiments, the conductive wires (conductive elements 132a or 132b) may not directly contact the hole walls of the through holes 112, but this disclosure is not limited thereto. In different embodiments, the conductive wires (conductive elements 132a or 132b) may partially contact the hole walls of the through holes 112. In some embodiments, the conductive wires (conductive elements 132a or 132b) can be made of metal wires, the material of which can include, for example, gold, copper, aluminum, or any of the combinations thereof, or any of their alloys.

Herein, the conductive wire (conductive element 132a or 132b) is defined with a wire diameter, which can be greater than or equal to 0.01 mm. In this embodiment, the wire diameter is the maximum diameter of the conductive wire. For example, the wire diameter can be 50 μm, 1 mil (about 25 μm, the material thereof can be, for example, copper or gold), 15 μm (the material thereof can be, for example, copper), or 10 μm (the material thereof can be, for example, gold). In some embodiments, the diameter of the conductive wire (conductive element 132a or 132b) can be greater than or equal to 0.005 μm. To be understood, the diameter of the conductive wire (conductive element 132a or 132b) should be less than the diameter of the through hole 112, so that the conductive wire can be placed into the through hole 112. In addition, the material of the viscid layer 131 can fully fill the entire through hole 112, but this disclosure is not limited thereto. In different embodiments, the material of the viscid layer 131 can partially fill the through hole 112 (with some gaps inside the through hole 112).

To be noted, the concept of the conductive "wire" depends on its aspect ratio thereof; in these cases, the conductive wire could be configured as a conductive pillar, directly filled in the through holes and electrically connected to the to the corresponding conductive portions, and a distal end of the conductive pillar electrically connected to the to the target conductive portions of the target supporting board with the conductive material by jetting and heating or without conductive material by laser welding.

Figure 4:
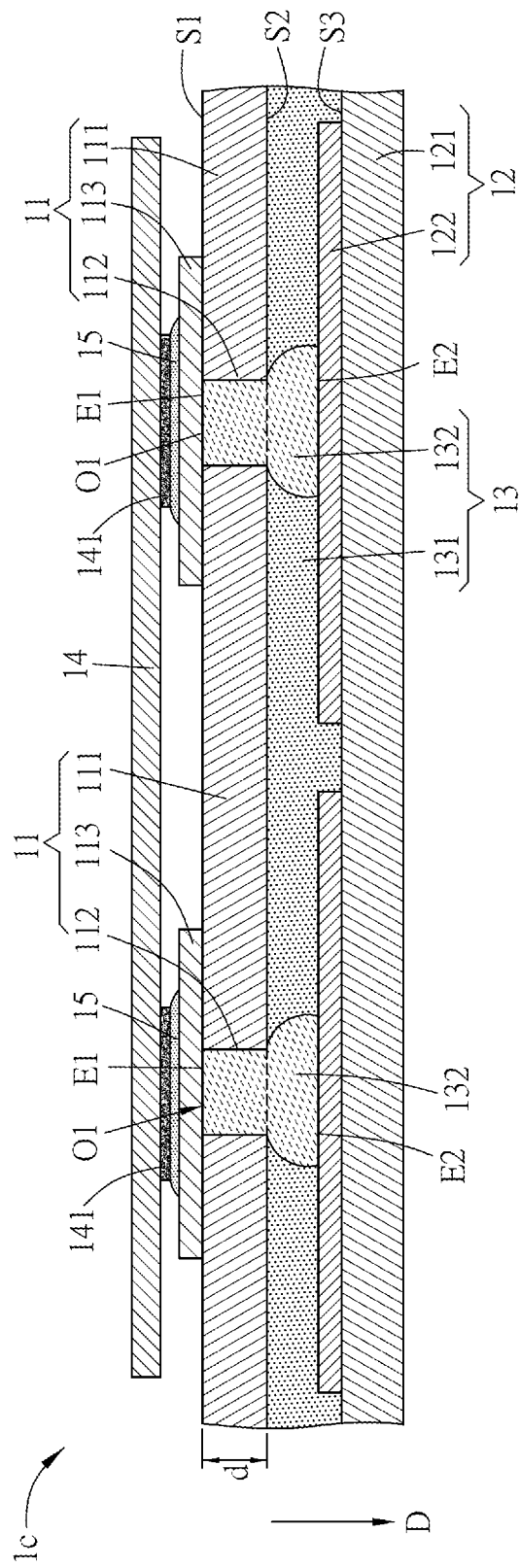

FIGS. 4 to 6 are schematic diagrams showing parts of electronic devices according to different embodiments of this disclosure.

Unlike the electronic device 1 of the previous embodiment, the electronic device 1c of this embodiment as shown in FIG. 4 further includes a plurality of electronic components 14, which are arranged on the first surface S1 of the carrier board 11. Each electronic component 14 includes at least one electrode 141, and the electrode 141 is electrically connected to one of the conductive portions 113. The electronic component 14 as shown in FIG. 4 includes two electrodes 141, and the two electrodes 141 are in contact with and electrically connected to two conductive portions 113, respectively. In this embodiment, the two electrodes 141 are electrically connected to two conductive portions 113 by jetting conductive material 15 (e.g. solder paste). In different embodiments, the electrodes 141 of the electronic component 14 can be electrically connected to the conductive portions 113 in the projection direction D of the carrier board 11, but this disclosure is not limited. In different embodiments, the electrodes 141 of the electronic component 14 can be electrically connected to the conductive elements 132 through the conductive pattern layer (or conductive layer) in an indirectly method. This disclosure is not limited thereto. In some embodiments, the electronic components can be arranged on the carrier board after the carrier board is connected to the laminated structure or the target supporting board. In some embodiments, the electronic components can be arranged on the substrate structure after the substrate structure is connected to the target supporting board. In some embodiments, the electronic components can be arranged on the substrate structure before the substrate structure is connected to the target supporting board. To be noted, the above examples are for illustrations only and are not to limit the scope of this disclosure. To be understood, in some embodiments, the conductive material 15 (e.g. solder paste) as shown in FIG. 2A or 4 and the electrode of the corresponding component can be formed as an integrity due to eutectic bonding.

In some embodiments, the electronic component 14 can be a millimeter or micrometer photoelectric chip or photoelectric package. In some embodiments, the electronic component 14 can at least include, for example but not limited to, an LED chip, a Mini LED chip, a Micro LED chip, a Micro sensor chip, or at least one package, or a photoelectric chip or package with an unlimited size such as in millimeters, micrometers or smaller. To be noted, the millimeter package can include the micrometer chip. In some embodiments, the electronic component 14 can include one photoelectric chip or package, so that the electronic component 14 can be realized as a single pixel. In some embodiments, the electronic component 14 can include multiple photoelectric chips or packages, so that it can be realized that the electronic component 14 includes multiple pixels. In some embodiments, the electronic component 14 can include red, blue, or green LED chips, Mini LED chips, or Micro LED chips, or other colors of LED, Mini LED, Micro LED or smaller chips or packages. When the electronic component 14 includes multiple photoelectric chips or packages, which are respectively red, blue and green LED, Mini LED, or Micro LED chips, a full-color LED, Mini LED, or micro LED display can be manufactured. The electronic component 14 of FIG. 4 is, for example, a die with horizontal electrodes. In different embodiments, the electronic component 14 can be a die with flip-chip electrodes or vertical electrodes, wherein the electrodes thereof can be electrically connected to the conductive portions 113 by wire bonding or flip-chip bonding. The aforementioned package is not limited to a package with active components or a passive package without active components. Herein, the active component can be, for example but not limited to, a thin-film transistor (TFT), a silicon IC or a non-silicon IC. In some embodiments, the electronic device 1b can further include one or more active devices corresponding to at least one of the above-mentioned electronic component 14, and the active device can be, for example but not limited to, a thin-film transistor (TFT), a silicon IC or a non-silicon IC. In some embodiments, the electronic component 14 can be a driving component, which includes at least one thin-film transistor (TFT), a silicon IC or a non-silicon IC for driving other components or packages.

In some embodiments, each of the board body 111 of the carrier board 11 or/and the target board body 121 of the target supporting board 12 can be a rigid board, a semi-rigid board, a resilient board, or a composite board. In some cases, the semi-rigid board could be elaborated as the resilient board, or one of the composite boards. When the board body 111 of the carrier board 11 and the target board body 121 of the target supporting board 12 are both resilient boards, the electronic device 1, 1a, 1b or 1c can be manufactured as a flexible electronic device, which can be easily curved and carried. In some embodiments, the board body 111 and the target board body 121 can be a transparent board, a semi-transparent board, or a non-transparent board. In some cases, the semi-transparent board could be elaborated as one kind of the transparent boards. When the board body 111 and the target board body 121 are transparent boards, the electronic device 1, 1a, 1b or 1c can be manufactured as a transparent electronic product such as, for example but not limited to, a transparent display device. When the board body 111 and the target board body 121 are transparent and resilient boards, it is possible to achieve the function of two-way light transmission. For example, if the electronic components 14 are Mini LEDs or Micro LEDs, the electronic device 1c can be manufactured as a two-way light transmission flexible light source or flexible display device.

In some embodiments, the electronic device can include a plurality of carrier boards 11, and the multiple carrier boards 11 can be spliced according to the required dimension so as to manufacture a large-sized electronic device (for example but not limited to a large-sized display device). To be understood, two adjacent carrier boards 11 can be arranged with a gap therebetween, or they can be tightly connected without a gap therebetween. This configuration can have the advantages of decreasing the size of the entire electronic device 1, 1a, 1b or 1c, increasing the arrangement density of components, or making the spliced carrier boards 11 have visual consistency. In some embodiments, multiple carrier boards 11 can be spliced in a two-dimensional array. In this disclosure, when detecting out that one electronic component 14 arranged on one of the carrier boards 11 is failed, the carrier board 11 with the failed electronic component 14 can be removed and replaced instead of removing the entire electronic device.

In the embodiment of splicing a plurality of carrier boards 11, the viscid layer 131 can be formed as a continuous layer (see FIG. 5), or it can be multiple separated portions (see FIG. 6). As shown in FIG. 6, the multiple viscid layers 131 can correspond different carrier boards 11. In other words, when multiple substrate structures (each including a carrier board 11 and a laminated structure 13) are arranged on the target supporting board 12, the number of the viscid layer 131 corresponds to the number of the carrier boards 11. In addition, when the carrier boards and the laminated structures 13 are individual and independent components, it is possible to provide one viscid layer 131 corresponding to one carrier board 11 or to provide one viscid layer 131 corresponding to multiple carrier boards 11. In practice, the insulation adhesive or silicone oil can be printed or coated on the supporting surface S3 of the target supporting board 12 facing the laminated structure 13. For example, the insulation adhesive or silicone oil can be printed or coated on the supporting surface S3 of the target supporting board 12 in one step according to a predetermined pattern, which has an opening configured for the target conductive portion 122. In another example, the insulation adhesive or silicone oil can be printed or coated on the supporting surface S3 in one step according to a plurality of predetermined patterns, which are individual and independent patterns and correspond to the viscid layers 131 of the carrier boards 11.

In some embodiments, in the projection direction D of the carrier board 11, a ratio of the projection area of the carrier board 11 to the projection area of the electronic component 14 is greater than or equal to 5. That is, (projection area of carrier board 11)/(projection area of electronic component 14)≥5. For example, the projection area of the carrier board 11 is 0.4 mm*0.4 mm=0.16 mm$^2$, and the projection area of the electronic component 14 is (3*0.0254) mm*(5*0.0254) mm=0.00%774 mm$^2$, so that (projection area of carrier board 11)/(projection area of electronic component 14)>16.53. For another example, the projection area of the carrier board 11 is 0.8 mm*0.8 mm=0.64 mm$^2$, and the projection area of the electronic component 14 is (5*0.0254) mm*(9*0.0254) mm=0.0290322 mm$^2$, so that (projection area of carrier board 11)/(projection area of electronic component 14)>22.04. For another example, the projection area of the carrier board 11 is 0.4 mm*0.4 mm=0.16 mm$^2$, and the projection area of the electronic component 14 is (5*0.0254) mm*(9*0.0254) mm=0.0290322 mm$^2$, so that (projection area of carrier board 11)/(projection area of electronic component 14)>5.51.

In some embodiments, the ratio of the projection area of the carrier board 11 to the projection area of the electronic component 14 can be greater than or equal to 50. For example, the projection area of the carrier board 11 is 0.4 mm*0.4 mm=0.16 mm², and the projection area of the electronic component 14 is 0.03 mm*0.06 mm=0.0018 mm², so that (projection area of carrier board 11)/(projection area of electronic component 14)=88.88. For another example, the projection area of the carrier board 11 is 0.8 mm*0.8 mm=0.64 mm², and the projection area of the electronic component 14 is (3*0.0254) mm*(5*0.0254) mm=0.0096774 mm², so that (projection area of carrier board 11)/(projection area of electronic component 14)>66.13. In some embodiments, the ratio of the projection area of the carrier board 11 to the projection area of the electronic component 14 can be greater than or equal to 100. For example, the projection area of the carrier board 11 is 0.46 mm*0.46 mm=0.2116 mm², and the projection area of the electronic component 14 is 0.03 mm*0.06 mm=0.0018 mm², so that (projection area of carrier board 11)/(projection area of electronic component 14)=117.56. The values in the above examples are for illustrations only and are not to limit the scope of this disclosure. To be noted, the shapes of the projection areas of the carrier board 11 and the electronic component 14 in the above calculation examples are squares, but this disclosure is not limited to squares.

In some embodiments, in the projection direction D of the carrier board 11, the electronic component 14 further defines a component width based on the size thereof, and the component width can be less than or equal to 80 mils (i.e., component width ≤80 mils). In some embodiments, the component width can be less than or equal to 12 mils (i.e., component width ≤12 mils). In some embodiments, the component width can be greater than or equal to 0.005 mm (i.e., component width ≥0.005 mm). For example, the component width can be 0.008 mm, 0.01 mm, 3 mils, 4 mils, 5 mils, 7 mils, etc.

As mentioned above, in the substrate structure and electronic device of this disclosure, the conductive portions of the carrier board are arranged on the first surface of the board body, and the first opening of each through hole is sealed by the corresponding conductive portion. The laminated structure includes a viscid layer and a plurality of conductive elements, and one surface of the viscid layer is in surface contact with the second surface of the board body. Each of the conductive elements passes through and accommodates in the viscid layer and corresponds to one through hole of the corresponding carrier board in the projection direction of the carrier board. One end of each conductive element is electrically connected to one of the conductive portions through the corresponding through hole. Based on this design, it is not needed to preserve a region on the board body of the carrier board for arranging the conductive elements (or through holes). Accordingly, the arrangement density of the conductive circuit (e.g. the conductive portions) and the corresponding electronic components on the carrier board can be increased, thereby allowing the substrate structure and electronic device to have a higher density layout.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A substrate structure, comprising:
a carrier board having a board body, a plurality of through holes and a plurality of conductive portions, wherein the board body is defined with a first surface and a second surface opposite to each other, the plurality of the through holes communicate the first surface and the second surface of the board body, each of the plurality of the through holes is defined with a first opening and a second opening opposite to each other, the plurality of the conductive portions are arranged on the first surface of the board body, and the first opening of each of the plurality of the through holes is sealed by corresponding one of the plurality of the conductive portions; and
a laminated structure comprising a viscid layer and a plurality of conductive elements, wherein the viscid layer is defined with two surfaces, one of the surfaces of the viscid layer is in surface contact with the second surface of the board body, each of the plurality of the conductive elements passes through and accommodates in the viscid layer, and corresponds to one of the plurality of the through holes of the carrier board in a projection direction of the carrier board, and one end of each of the plurality of the conductive elements is electrically connected to one of the plurality of the conductive portions through the corresponding through hole,
wherein the board body is a resilient board, a rigid board or a composite board.

2. The substrate structure of claim 1, wherein a thickness of the board body is less than or equal to 0.2 mm.

3. The substrate structure of claim 1, wherein a diameter of one of the plurality of the through holes is less than or equal to 200 μm.

4. The substrate structure of claim 1, wherein the material of one of the plurality of the conductive elements comprises tin, copper, silver or gold, or an alloy of any combination thereof, or an intermetallic compound.

5. The substrate structure of claim 1, wherein the viscid layer comprises a non-conductive polymer material.

6. The substrate structure of claim 1, wherein at least a part of the plurality of the conductive portions are multiple conductive pads.

7. An electronic device, comprising:
a carrier board having a board body, a plurality of through holes and a plurality of conductive portions, wherein the board body is defined with a first surface and a second surface opposite to each other, the plurality of the through holes communicate the first surface and the second surface of the board body, each of the plurality of the through holes is defined with a first opening and a second opening opposite to each other, the plurality of the conductive portions are arranged on the first surface of the board body, and the first opening of each of the plurality of the through holes is sealed by corresponding one of the plurality of the conductive portions;
a target supporting board having a target board body and a plurality of target conductive portions, wherein one surface of the target board body close to the carrier board is defined as a supporting surface, the plurality of the target conductive portions are arranged on the supporting surface of the target board body, and at least a part of the plurality of the target conductive portions of the target supporting board correspond to the plurality of the through holes of the carrier board in a projection direction of the carrier board; and
a laminated structure arranged between the carrier board and the target supporting board, wherein the laminated structure comprises a viscid layer and a plurality of conductive elements, one surface of the viscid layer is in surface contact with the second surface of the board body, another surface of the viscid layer is in surface contact with the supporting surface of the target board body, each of the plurality of the conductive elements passes through and accommodates in the viscid layer, and in the projection direction of the carrier board, one end of each of the plurality of the conductive elements is electrically connected to one of the plurality of the conductive portions through the corresponding through hole, and another end of the conductive element is electrically connected to one of the plurality of the target conductive portions, wherein the board body is a resilient board, a rigid board or a composite board.

8. The electronic device of claim 7, wherein a thickness of the board body is less than or equal to 0.2 mm.

9. The electronic device of claim 7, wherein a diameter of one of the plurality of the through holes is less than or equal to 200 μm.

10. The electronic device of claim 7, wherein the material of one of the plurality of the conductive elements comprises tin, copper, silver or gold, or an alloy of any combination thereof, or an intermetallic compound.

11. The electronic device of claim 7, wherein at least a part of the plurality of the conductive portions are multiple conductive pads.

12. The electronic device of claim 7, further comprising:
a plurality of electronic components arranged on the first surface of the carrier board, wherein each of the electronic components comprises an electrode, and the electrode is electrically connected to one of the plurality of the conductive portions.

13. The electronic device of claim 12, wherein the electronic components comprise a plurality of photoelectric chips or photoelectric packages.

14. The electronic device of claim 7, wherein the electronic device comprises a plurality of the carrier boards.

15. The electronic device of claim 14, wherein the electronic device comprises a plurality of the viscid layers, and the plurality of the viscid layers are disposed correspondingly to the carrier boards.

16. The electronic device of claim 7, wherein the target board body is a resilient board.

* * * * *